US010877075B2

(12) United States Patent
Okuyama et al.

(10) Patent No.: US 10,877,075 B2
(45) Date of Patent: Dec. 29, 2020

(54) CURRENT SENSOR

(71) Applicant: Hitachi Metals, Ltd., Tokyo (JP)

(72) Inventors: Ken Okuyama, Tokyo (JP); Naoki Futakuchi, Tokyo (JP); Haruyasu Komano, Tokyo (JP); Jun Umetsu, Tokyo (JP); Yujiro Tomita, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 34 days.

(21) Appl. No.: 16/157,192

(22) Filed: Oct. 11, 2018

(65) Prior Publication Data
US 2019/0170793 A1 Jun. 6, 2019

(30) Foreign Application Priority Data

Dec. 5, 2017 (JP) .................................. 2017-233681

(51) Int. Cl.
*G01R 15/20* (2006.01)
*G01R 33/09* (2006.01)
*G01R 33/025* (2006.01)
*G01R 19/00* (2006.01)
*G01R 15/14* (2006.01)

(52) U.S. Cl.
CPC ......... *G01R 15/205* (2013.01); *G01R 15/148* (2013.01); *G01R 15/207* (2013.01); *G01R 19/0092* (2013.01); *G01R 33/025* (2013.01); *G01R 33/093* (2013.01)

(58) Field of Classification Search
None
See application file for complete search history.

(56) References Cited

U.S. PATENT DOCUMENTS

2015/0204916 A1* 7/2015 Akimoto ............ G01R 19/0092
702/64
2018/0097416 A1* 4/2018 Dang ....................... H02K 3/28

FOREIGN PATENT DOCUMENTS

JP 2016-200438 A 12/2016

* cited by examiner

*Primary Examiner* — Jermele M Hollington
*Assistant Examiner* — Suresh K Rajaputra
(74) *Attorney, Agent, or Firm* — Scully, Scott, Murphy & Presser, PC

(57) ABSTRACT

A current sensor includes first and second bus bars aligned and arranged in such a manner to be spaced from each other in a plate width direction, a third bus bar arranged in such a manner that a plate thickness direction thereof coincides with a plate thickness direction of the first and second bus bars and a length direction thereof is orthogonal to a length direction of the first and second bus bars, first and second magnetic detection elements arranged opposite the first and second bus bars respectively in the plate thickness direction, and a third magnetic detection element arranged opposite the third bus bar in the plate thickness direction. The first and second magnetic detection elements are gradient detection type magnetic detection elements and are arranged in such a manner that a detection axis direction thereof is perpendicular to the length direction of the first and second bus bars and is tilted with respect to the plate thickness direction of the first and second bus bars. The third magnetic detection element is arranged in such a manner that a detection axis direction thereof coincides with a plate width direction of the third bus bar.

6 Claims, 5 Drawing Sheets

WHEN DIRECT CURRENT IS PASSED THROUGH THE FIRST BUS BAR
→THE MAGNETIC FLUX DENSITIES DETECTED AT TWO MAGNETIC
SENSING POSITIONS OF THE FIRST MAGNETIC DETECTION ELEMENT

WHEN DIRECT CURRENT IS PASSED THROUGH THE FIRST BUS BAR
→THE MAGNETIC FLUX DENSITIES DETECTED AT TWO MAGNETIC
SENSING POSITIONS OF THE SECOND MAGNETIC DETECTION ELEMENT

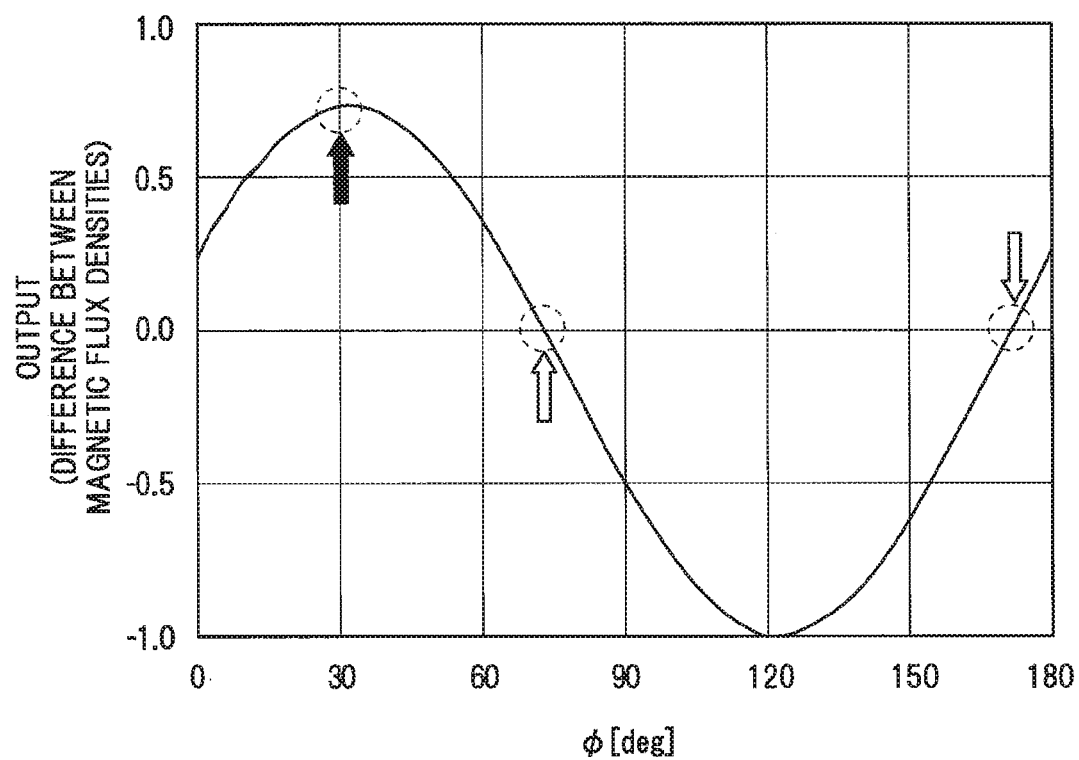

CURRENT SENSOR

CROSS-REFERENCE TO RELATED APPLICATIONS

The present application is based on Japanese patent application No. 2017-233681 filed on Dec. 5, 2017, the entire contents of which are incorporated herein by reference.

BACKGROUND OF THE INVENTION

1. Field of the Invention

The present invention relates to a current sensor.

2. Description of the Related Art

Conventionally, there is known a current sensor including a magnetic detection element for detecting the strength of a magnetic field generated by a current to be measured (see, e.g., JP-A-2016-200438). By detecting the strength of the magnetic field with the magnetic detection element, it is possible to calculate the current, based on the strength of the magnetic field.

In JP-A-2016-200438, there is described a current sensor that detects currents flowing through two bus bars (conductors) by using two magnetic detection elements respectively. It is described that in this current sensor, the influence of the current flowing through the bus bar which is not a target of current detection is suppressed by disposing the magnetic detection elements so that a magnetic sensing direction straight line (straight line along a detection axis direction) faces the bus bar which is not a target of current detection, more preferably so that the magnetic sensing direction straight line (straight line along the detection axis direction) is orthogonal to the direction of the magnetic field caused by the current flowing through the bus bar which is not a target of current detection.

SUMMARY OF THE INVENTION

Now, three-phase alternating currents are transmitted between an inverter and a motor, for example. In the current sensor for measuring the currents of each phase of the three-phase alternating currents, it is necessary to minimize the influence of the currents flowing through the bus bars of the other phases which are not a target of current detection on the magnetic sensing element, in other words, it is desirable to minimize the interference between the three phases.

It is therefore an object of the present invention to provide a current sensor which suppresses the interference between three phases to ensure an improvement in detection accuracy.

In order to solve the above problem, the present invention provides a current sensor, comprising:
three bus bars, each of which is formed in a plate shape and through which respective phase currents of three-phase alternating currents respectively flow; and
three magnetic detection elements to detect a magnetic field strength generated by the currents flowing through the corresponding bus bars,
wherein the three bus bars include first and second bus bars aligned and arranged in such a manner to be spaced from each other in a plate width direction, and a third bus bar arranged in such a manner that a plate thickness direction thereof coincides with the plate thickness direction of the first and second bus bars and a length direction thereof is orthogonal to the length direction of the first and second bus bars,
wherein the three magnetic detection elements include first and second magnetic detection elements arranged opposite the first and second bus bars respectively in the plate thickness direction, and a third magnetic detection element arranged opposite the third bus bar in the plate thickness direction,
wherein the first and second magnetic detection elements are gradient detection type magnetic detection elements that output a difference between magnetic field strengths detected at two magnetic sensing positions, respectively, and are arranged in such a manner that a detection axis direction thereof is perpendicular to the length direction of the first and second bus bars and is tilted with respect to the plate thickness direction of the first and second bus bars,
wherein the third magnetic detection element is arranged in such a manner that a detection axis direction thereof coincides with the plate width direction of the third bus bar.

Points of the Invention

According to the present invention, it is possible to provide the current which suppresses the interference between three phases to ensure an improvement in detection accuracy.

BRIEF DESCRIPTION OF THE DRAWINGS

FIG. 4 is a graph showing a change with the angle ϕ of the output of a second magnetic detection element when a direct current is passed through the first bus bar.

DETAILED DESCRIPTION OF THE PREFERRED EMBODIMENTS

Embodiment

An embodiment of the present invention will be described below with reference to the accompanying drawings.

Figure 1A:
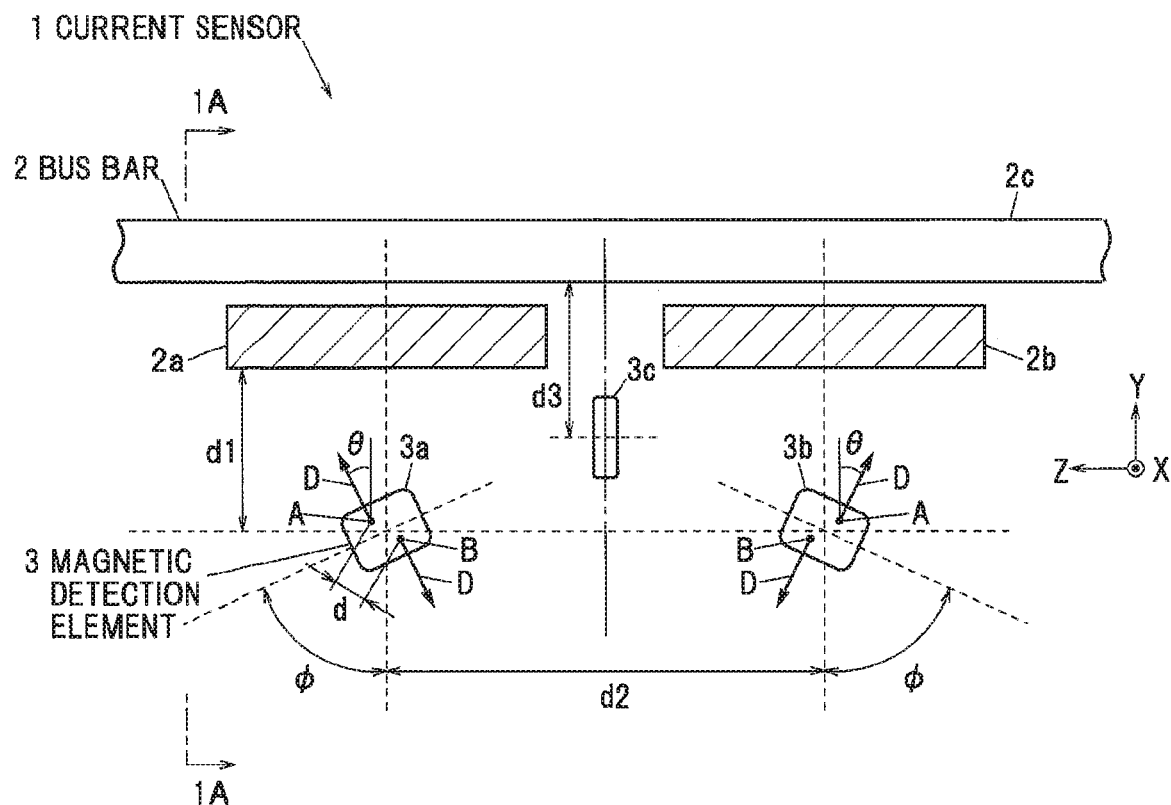
FIG. 1A is a cross-sectional view showing a current sensor according to one embodiment of the present invention where its cross section is perpendicular to a length direction of first and second bus bars.
Figure 1B:
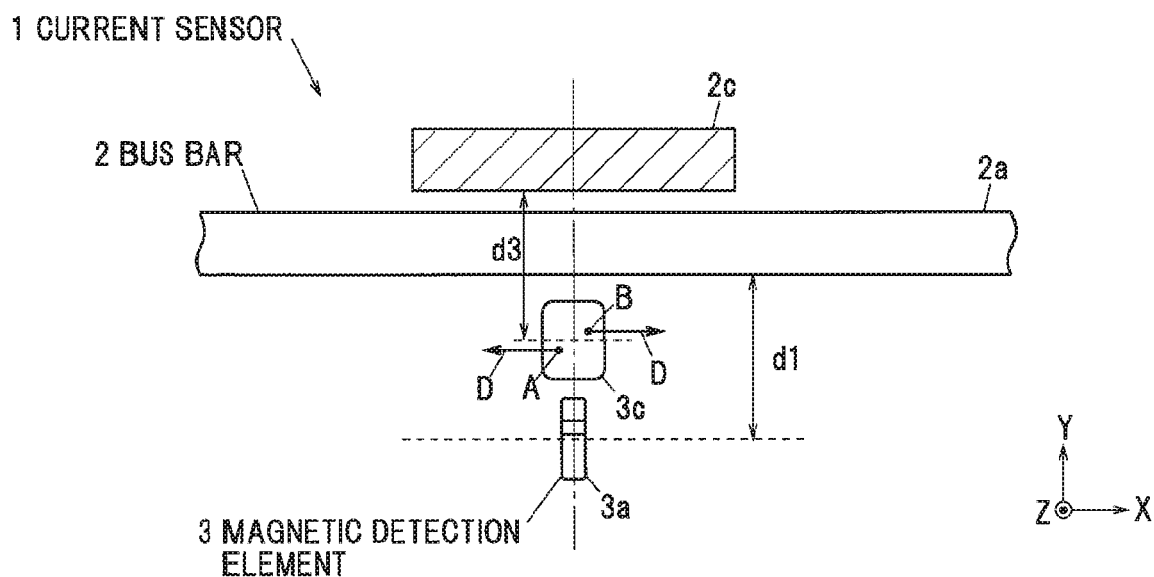
FIG. 1B is a cross-sectional view taken along line 1A-1A in FIG. 1A.

FIGS. 1A and 1B show a current sensor according to the present embodiment, where FIG. 1A is a cross-sectional view showing a cross section perpendicular to a length direction of first and second bus bars, and FIG. 1B is a cross-sectional view taken along line 1A-1A in FIG. 1A.

Figure 2:
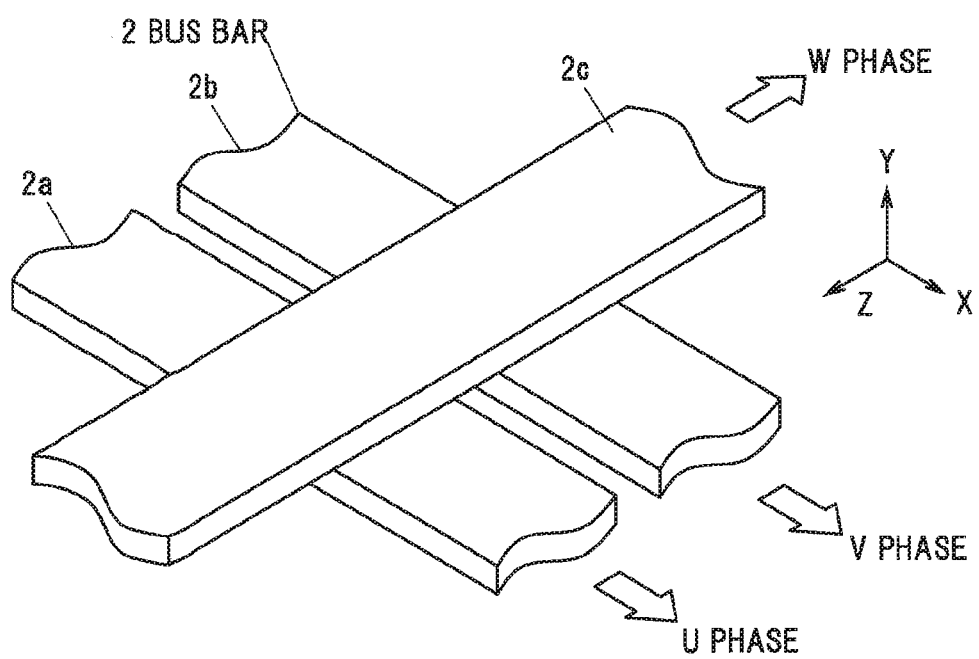
FIG. 2 is a perspective view showing the arrangement of bus bars.

FIG. 2 is a perspective view showing the arrangement of bus bars. As shown in FIGS. 1A, 1B and 2, a current sensor 1 includes three bus bars 2 and three magnetic detection elements 3. Note that in FIG. 2, the magnetic detection elements 3 are omitted.

Each of bus bars 2 is a plate-like conductor made of a good electric conductor such as copper or aluminum, and serves as a current path through which current flows. The bus bars 2 are used as, e.g., a power supply line between a motor and an inverter in an electric vehicle or a hybrid vehicle. In the present embodiment, a case where three bus bars 2 corresponding to three-phase alternating currents are used will be described. The thicknesses of the bus bars 2 are, e.g., 3 mm.

The three bus bars 2 include a first bus bar 2a and a second bus bar 2b aligned and arranged in such a manner to be spaced from each other in a plate width direction, and a third bus bar 2c arranged in such a manner that a plate thickness direction thereof coincides with the plate thickness direction of the first and second bus bars 2a and 2b and a length direction thereof is orthogonal to the length direction of the first and second bus bars 2a and 2b. The first and second bus bars 2a and 2b are disposed on one side of the third bus bar 2c in the plate thickness direction. In the present embodiment, a U phase current flows through the first bus bar 2a, a V phase current flows through the second bus bar 2b, and a W phase current flows through the third bus bar 2c.

Hereinafter, the length direction of the first and second bus bars 2a and 2b (the plate width direction of the third bus bar 2c) is referred to as the X direction, the plate thickness direction of each bus bar 2a to 2c is referred to as the Y direction, and the plate width direction (the length direction of the third bus bar 2c) of the first and second bus bars 2a and 2b is referred to as the Z direction. The distances along the Y direction between the third bus bar 2c and the first bus bar 2a and between the third bus bar 2c and the second bus bar 2b are the same distances.

The magnetic detection elements 3 are for detecting the strengths of the magnetic fields generated by the currents flowing through the corresponding bus bars 2. The three magnetic detection elements 3 include first and second magnetic detection elements 3a and 3b arranged opposite the first and second bus bars 2a and 2b respectively in the Y direction (the plate thickness direction), and arranged so that their distances d1 along the Y direction (the plate thickness direction) from the corresponding first and second bus bars 2a and 2b are equal to each other, and a third magnetic detection element 3c arranged opposite the third bus bar 2c in the Y direction (the plate thickness direction). The first magnetic detection element 3a and the second magnetic detection element 3b are arranged side by side in the Z direction. Note that although it is desirable that the distance between the second bus bar 2b and the second magnetic detection element 3b is equal to the distance between the first bus bar 2a and the first magnetic detection element 3a, e.g., it may be 0.99 to 1.01 times (in the case where they are substantially equal) due to manufacturing error and the like.

Here, the distances d1 between the bus bars 2a and 2b and the magnetic detection elements 3a and 3b are more specifically the distances from the surfaces on the magnetic detection elements 3a and 3b side of the bus bars 2a and 2b to the center positions (the center positions in the width direction, the length direction, and the thickness direction) of the magnetic detection elements 3a and 3b. Similarly, the distance between the third bus bar 2c and the third magnetic detection element 3c, that is, the distance from the surface on the third magnetic detection element 3c side of the third bus bar 2c to the center position of the third magnetic detection element 3c is d3.

The three magnetic detection elements 3a to 3c are arranged in such a manner that their center positions are opposed to the plate width direction center positions of the corresponding bus bars 2a to 2c in the thickness direction. In the present embodiment, the third magnetic detection element 3c is disposed at a position on the first and second bus bars 2a and 2b side of the third bus bar 2c and between the first bus bar 2a and the second bus bar 2b in the Z direction. More specifically, the third magnetic detection element 3c is disposed in such a manner that the center position of the third magnetic detection element 3c is opposed to an intermediate position between the first bus bar 2a and the second bus bar 2b in the Z direction in the Y direction (in other words, the Z direction position of the center position is equal to the Z direction position of the intermediate position between the first bus bar 2a and the second bus bar 2b.).

By disposing the third magnetic detection element 3c on the first and second bus bars 2a and 2b side of the third bus bar 2c, it is possible to bring the arrangement positions of the three magnetic detection elements 3a to 3c close to each other and mount them on a common circuit board (not shown), thereby contributing to size reduction of the current sensor 1. However, the present invention is not limited to this, but the third magnetic detection element 3c may be disposed on the opposite side of the third bus bar 2c to the first and second bus bars 2a and 2b. In this case, since the distances between the third magnetic detection element 3c and the first and second bus bars 2a and 2b are increased, the influence of the disturbance in the third magnetic detection element 3c (the influences of the magnetic fields generated at the first and second bus bars 2a and 2b) are further suppressed.

In the current sensor 1 according to the present embodiment, as the first and second magnetic detection elements 3a and 3b, a magnetic detection element of a gradient detection type having two magnetic sensing positions A and B to output a difference between magnetic field strengths detected at both the magnetic sensing positions respectively is used. As the first and second magnetic detection elements 3a and 3b, a GMR (Giant Magneto Resistive Effect) element of a gradient detection type for example can be used.

In the magnetic detection elements 3 of the gradient detection type, since the difference between the magnetic field strengths detected at the magnetic sensing positions A and B is outputted, the disturbances that can be regarded as a uniform distribution with respect to the space (such as magnetic fields from devices located at sufficiently far distances, geomagnetism and the like) are canceled out. That is, by using the magnetic detection elements 3 of the gradient detection type, it is possible to suppress the deterioration of the detection accuracy due to the influences of the disturbances.

(Suppression of the Interference Between the U Phase and the V Phase)

In the magnetic detection element 3 of the gradient detection type, since the two magnetic sensing positions A and B are spaced from each other, no same magnetic field strengths are detected at the magnetic sensing positions A and B for a disturbance having a near magnetic field generation position and a large magnetic field gradient at the positions of the magnetic detection elements 3. This would be a factor of a detection error. Therefore, the magnetic fields generated at the bus bars 2 (The second bus bar 2b for the first magnetic detection element 3a, and the first bus bar 2a for the second magnetic detection element 3b, that are hereinafter collectively referred to as "adjacent bus bars 2".) which are not a target of current detection would be a factor of a detection error.

Therefore, in the present embodiment, the first and second magnetic detection elements 3a and 3b are arranged in such a manner that their detection axis directions are perpendicular to the X direction (the length direction of the first and second bus bars 2a and 2b) and are tilted with respect to the Y direction (the plate thickness direction). This makes it possible to equalize the magnetic fields from the adjacent bus bars 2 detected at the two magnetic sensing positions A and B of the first and second magnetic detection elements 3a and 3b and makes it possible to suppress the influences of the magnetic fields generated at the adjacent bus bars 2. In FIGS. 1A and 1B, the detection axis is denoted by character D.

Furthermore, in the present embodiment, the tilt angles θ (absolute value) of the detection axis directions with respect to the Y direction (the plate thickness direction) in the first and second magnetic detection elements 3a and 3b are set to be substantially the same angles, and the tilt directions with respect to the Y direction (the plate thickness direction) are set at the opposite directions. In the example of FIG. 1A, a case is shown where the detection axis direction of the first magnetic detection element 3a disposed in the left side of the figure is tilted in the counterclockwise direction and the detection axis direction of the second magnetic detection element 3b disposed in the right side of the drawing is tilted in the clockwise direction. However, the present invention is not limited to this, but it is also possible to tilt the detection axis direction of the first magnetic detection element 3a in the clockwise direction and tilt the detection axis direction of the second magnetic detection element 3b in the counterclockwise direction. The tilt angles θ of the first and second magnetic detection elements 3a and 3b will be described later.

The two magnetic detection elements 3a and 3b are arranged so as to be symmetrical with respect to a plane having a normal direction in the Z direction (the plate width direction of the first and second bus bars 2a and 2b), that is, the XY plane. Incidentally, the symmetry here also includes that the magnetic sensing positions A and B of the two magnetic detection elements 3a and 3b are arranged symmetrically. In other words, the first and second magnetic detection elements 3a and 3b are arranged so that the magnetic sensing positions A and B are bilaterally symmetrical in a cross-sectional view perpendicular to the X direction (the length direction of the first and second bus bars 2a and 2b). By symmetrically arranging the two magnetic detection elements 3a and 3b, it is possible to equalize the amplitudes of the magnetic flux densities detected by the two magnetic detection elements 3a and 3b, so the handling of the current sensor 1 (management of detection accuracy and the like) becomes easy.

(Suppression of the Interferences Between the U Phase and the V Phase, and the W Phase)

In the present embodiment, the third bus bar 2c is disposed so as to be perpendicular to the first and second bus bars 2a and 2b. Therefore, the direction of the magnetic field generated by the current flowing through the third bus bar 2c is substantially perpendicular to the detection axis D at the magnetic sensing positions A and B of the first and second magnetic detection elements 3a and 3b. Therefore, the influence of the magnetic field generated by the current flowing through the third bus bar 2c on the detection results of the first and second magnetic detection elements 3a and 3b is suppressed.

In order to further suppress the influence of the magnetic field generated by the current flowing through the third bus bar 2c, it is preferable that the center positions of the first and second magnetic detection elements 3a and 3b are disposed opposite the plate width direction center position of the third bus bar 2c in the Y direction (the plate thickness direction).

Furthermore, in the present embodiment, the third magnetic detection element 3c is arranged so that its detection axis direction coincides with the X direction (the plate width direction of the third bus bar 2c). Therefore, the directions of the magnetic fields generated by the currents flowing through the first and second bus bars 2a and 2b are substantially perpendicular to the detection axis D at the magnetic sensing positions A and B of the third magnetic detection element 3c. Therefore, the influences of the magnetic fields generated by the currents flowing through the first and second bus bars 2a and 2b on the detection result of the third magnetic detection element 3c are suppressed.

In the present embodiment, in order to suppress the influence of disturbance, a gradient detection type magnetic detection element is also used as the third magnetic detection element 3c. However, since the third magnetic detection element 3c is insensitive to the magnetic fields generated by the currents flowing through the first and second bus bars 2a and 2b as described above, a magnetic detection element of a type that detects the magnitude of the magnetic field at one magnetic sensing position may be used for the magnetic detection element 3c.

Also, as described above, by arranging the first and second magnetic detection elements 3a and 3b symmetrically with respect to the XY plane, it is possible to equalize the amplitudes of the magnetic flux densities detected, but for the third magnetic detection element 3c, by appropriately adjusting the distance d3 from the third bus bar 2c, it is possible to make the amplitude of the detected magnetic flux density equal to those of the first and second magnetic detection elements 3a and 3b.

(With respect to the tilt angles θ of the first and second magnetic detection elements 3a and 3b)

In the case of using the magnetic detection elements 3a and 3b having a distance d between the magnetic sensing positions A and B of 1.2 mm, the magnetic field strengths detected at the magnetic sensing positions A and B of both the magnetic detection elements 3a and 3b when the tilt angles θ were varied were found by simulation. In the simulation, the distances d1 between the first and second bus bars 2a and 2b and the first and second magnetic detection elements 3a and 3b were set at 10 mm, the arrangement pitches in the width direction of the bus bars 2a and 2b and the magnetic detection elements 3a and 3b (the distances between the Z direction center positions of the bus bars 2a and 2b and the magnetic detection elements 3a and 3b) were set at 20.5 mm, the widths of both the bus bars 2a and 2b were set at 15 mm, and the thicknesses of both the bus bars 2a and 2b were set at 3 mm.

Figure 3A:
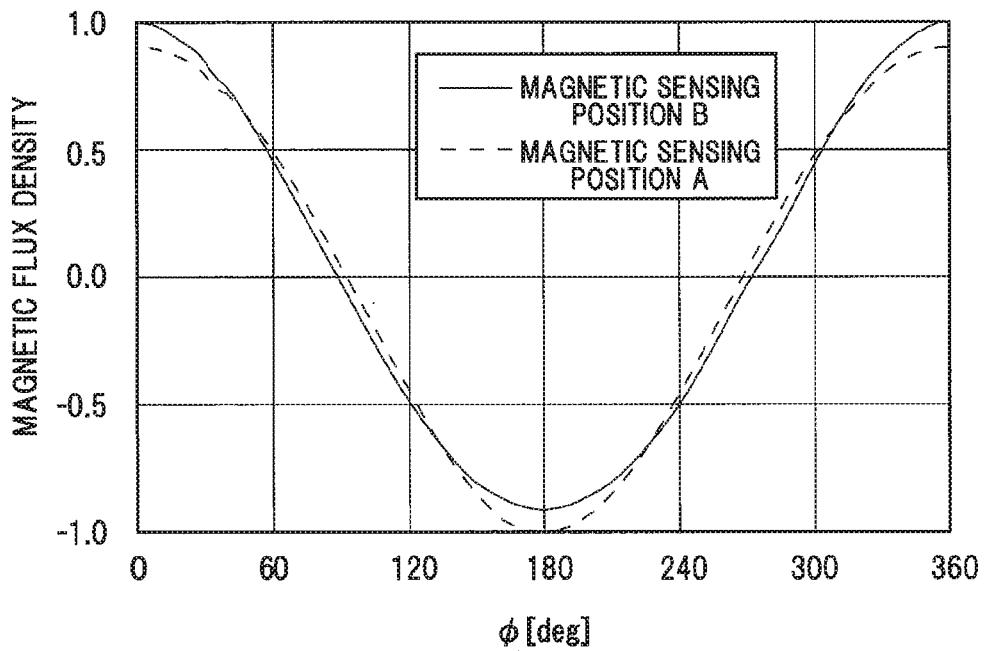
FIG. 3A is a graph showing changes with the angle ϕ of the magnetic field strengths detected by two magnetic sensing elements of a first magnetic detection element when a direct current is passed through a first bus bar.
Figure 3B:
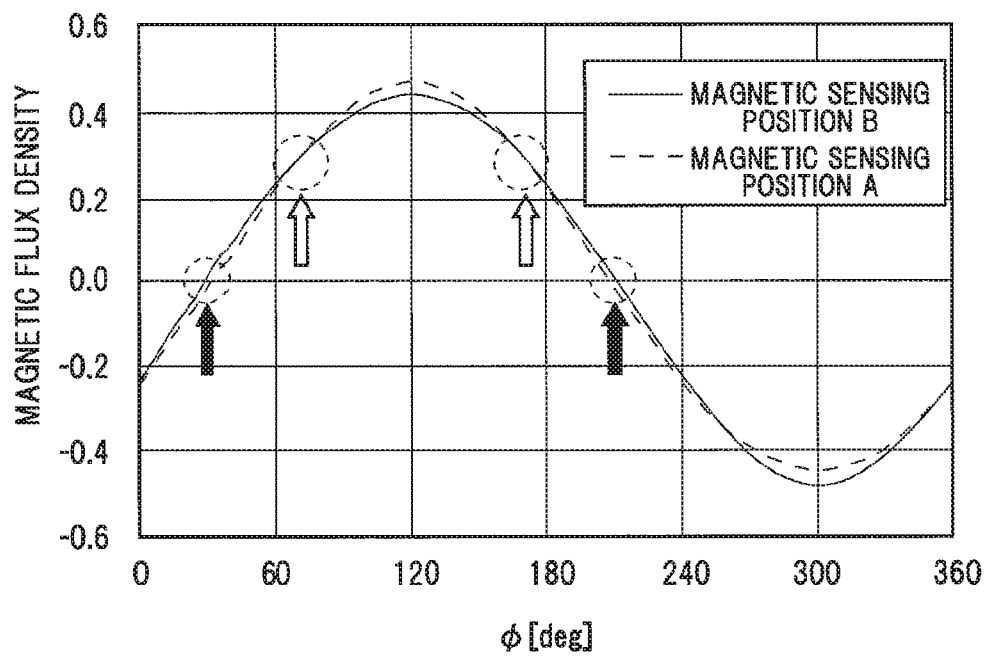
FIG. 3B is a graph showing changes with the angle ϕ of the magnetic field strengths detected by two magnetic sensing elements of a second magnetic detection element when a direct current is passed through the first bus bar.

FIG. 3A shows changes with the angle φ of the magnetic field strengths (magnetic flux densities) detected at the two magnetic sensing positions A and B of the first magnetic detection element 3a when a direct current is passed through the first bus bar 2a. Also, FIG. 3B shows changes with the angle φ of the magnetic field strengths (magnetic flux densities) detected at the two magnetic sensing positions A and B of the second magnetic detecting element 3b, when a direct current is passed through the first bus bar 2a. Further, FIG. 4 shows a change with the angle φ of the output (the difference between the magnetic flux densities at the magnetic sensing positions A and B) of the second magnetic detecting element 3b, when a direct current is passed through the first bus bar 2a. Note that the angle φ is the angle between the direction perpendicular to the detection axis direction and the Y direction (the plate thickness direction), and is represented by φ=90−θ (see FIG. 1A).

In FIGS. 3A and 3B, the magnetic flux density on the vertical axis is normalized with reference to the magnetic flux density detected at the magnetic sensing position B of the first magnetic detecting element 3a when φ=0 degrees. Also, in FIG. 4, the difference between the magnetic flux densities on the vertical axis is normalized at a value at which the absolute value is maximum (the difference in the magnetic flux density at an angle φ of about 120 degrees).

As shown in FIG. 3A, when an electric current is flowing through the corresponding first bus bar 2a, when the angle φ (the tilt angle θ) of the first magnetic detection element 3a is changed, the magnetic fluxes detected at both the magnetic sensing positions A and B periodically change. Note that in FIG. 3A, the magnetic flux densities detected at the magnetic sensing positions A and B of the first magnetic detecting element 3a when a current is passed through the first bus bar 2a are shown, but when a current is passed through the second bus bar 2b, the magnetic flux densities detected at the magnetic sensing positions A and B of the second magnetic detecting element 3b also have the same characteristics.

On the other hand, as shown in FIG. 3B, even when a current is flowing through the noncorresponding first bus bar 2a, the magnetic flux density is detected at the magnetic sensing positions A and B of the second magnetic detection element 3b. Also in this case, when the angle φ (the tilt angle θ) of the second magnetic detection element 3b is changed, similarly to FIG. 3A, the magnetic fluxes detected at the both magnetic sensing positions A and B periodically change. As shown in FIG. 4, the output of the second magnetic detection element 3b, that is, the difference between the magnetic flux densities detected at the both magnetic sensing positions A and B, also changes periodically when the angle φ (the tilt angle θ) of the second magnetic detection element 3b is changed. Note that in FIGS. 3B and 4, the magnetic flux densities detected at the magnetic sensing positions A and B of the first magnetic detecting element 3b and the difference therebetween when a current is passed through the first bus bar 2a are shown, but when a current is passed through the second bus bar 2b, the magnetic flux densities detected at the magnetic sensing positions A and B of the second magnetic detecting element 3b and the difference therebetween also have the same characteristics.

Here, as indicated by outlined arrows in FIGS. 3B and 4, in this example, the magnetic flux densities detected at the two magnetic sensitive positions A and B have the same values at the angles φ of about 70 degrees and about 170 degrees (the tilt angle θ is about 20 degrees and about −80 degrees), and the output (the difference between the magnetic flux densities detected at the two magnetic sensing positions A and B) becomes substantially zero. That is, by setting the angle φ at about 70 degrees or about 170 degrees, it is possible to suppress the influence of the magnetic field from the adjacent bus bar 2.

Incidentally, in the conventional technique in which the magnetic detection element is arranged so that the direction of the detection axis is orthogonal to the direction of the magnetic field from the adjacent bus bar 2, as indicated by the solid arrow in FIG. 3B, the angle φ (the tilt angle θ) is set at an angle at which the detected magnetic field strength becomes 0. In this example, the angle φ is set at about 30 degrees or about 210 degrees. However, as indicated by the solid arrow in FIG. 4, at this angle, the difference between the magnetic flux densities detected at the two magnetic sensing positions A and B does not become zero and the influence of the magnetic field from the adjacent bus bar 2 cannot be suppressed. In this example, when the angle φ is set according to the conventional technique, the output of the second magnetic detection element 3b becomes substantially the maximum value, and the influence of the magnetic field from the adjacent bus bar 2 becomes very large.

The characteristics shown in FIGS. 3 and 4 vary depending on the distances d between the magnetic sensing positions A and B of the first and second magnetic detection elements 3a and 3b, the distances d1 between the first and second bus bars 2a and 2b and the first and second magnetic detection elements 3a and 3b, the arrangement pitches d2 in the width direction of the first and second bus bars 2a and 2b and the first and second magnetic detection elements 3a and 3b, etc., and the optimum tilt angle θ (angle φ) also changes accordingly. Therefore, in consideration of the arrangement of the first and second bus bars 2a and 2b and the first and second magnetic detection elements 3a and 3b and the like, it is preferable to set the tilt angle θ (angle φ) at which the influence of the magnetic field from the adjacent bus bar 2 is minimized.

The ratio Db/Da×100 of the difference Db between the magnetic field strengths detected at the two magnetic sensing positions A and B by the current flowing through the noncorresponding bus bar 2a, 2b (the adjacent bus bar 2) to the difference Da between the magnetic field strengths detected at the two magnetic sensing positions A and B by the current flowing through the corresponding bus bar 2a, 2b is desirably 0.5% or less, more desirably 0.1% or less. In other words, the tilt angle θ is preferably set at an angle at which the ratio Db/Da×100 is 0.5% or less, more preferably 0.1% or less.

(Operation and Advantageous Effects of the Embodiment)

As described above, the current sensor 1 according to the present embodiment includes the first and second bus bars 2a and 2b aligned and arranged in such a manner to be spaced from each other in the plate width direction, the third bus bar 2c arranged in such a manner that the plate thickness direction thereof coincides with the plate thickness direction of the first and second bus bars 2a and 2b and the length direction thereof is orthogonal to the length direction of the first and second bus bars 2a and 2b, the first and second magnetic detection elements 3a and 3b arranged opposite the first and second bus bars 2a and 2b respectively in the plate thickness direction, and the third magnetic detection element 3c arranged opposite the third bus bar 2c in the plate thickness direction. Further, the first and second magnetic detection elements 3a and 3b are gradient detection type magnetic detection elements that output a difference between magnetic field strengths detected at the two magnetic sensing positions A and B, respectively, and are arranged in such a manner that the detection axis direction thereof is perpendicular to the length direction of the first and second bus bars 2a and 2b and is tilted with respect to the plate thickness direction of the first and second bus bars 2a and 2b, and the third magnetic detection element 3c is arranged in such a manner that the detection axis direction thereof coincides with the plate width direction of the third bus bar 2c.

As a result, it is possible to realize both the suppression of the interference between the U phase and the V phase and the suppression of the interference between the U phase and the V phase, and the W phase, and it is possible to realize the high precision current sensor 1 with the suppressed mutual interferences between the three phases.

(Modifications)

Although in the above embodiment, the case where the U phase and V phase currents are passed through the parallel arranged first and second bus bars 2a and 2b respectively while the W phase current is passed through the third bus bar 2c orthogonal thereto has been described, the phases of the currents passed through each bus bar 2a to 2c are not limited to this, but for example, a U phase current may be passed through the third bus bar 2c.

Figure 5:
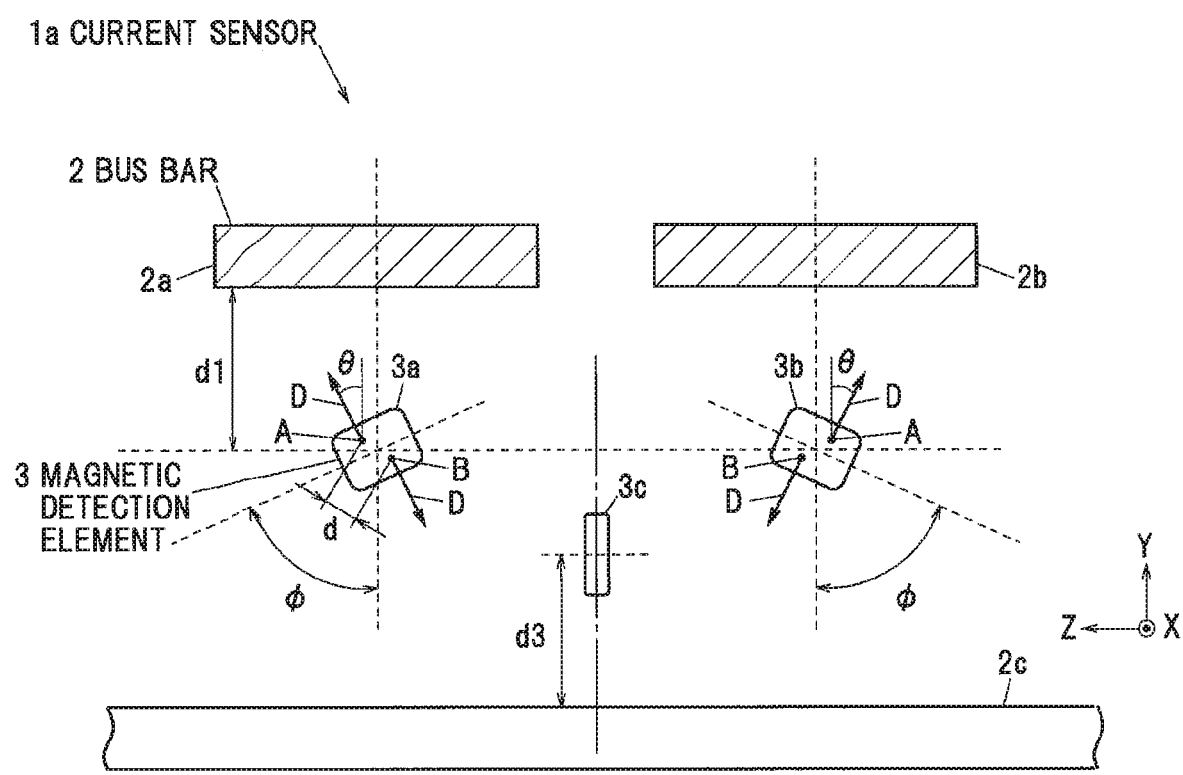
FIG. 5 is a cross-sectional view showing a current sensor according to one modification to the present invention.

Further, in the above embodiment, the magnetic detection elements 3a to 3c are disposed on the opposite side of the first and second bus bars 2a and 2b to the third bus bar 2c, but as in a current sensor 1a shown in FIG. 5, the first and second bus bars 2a and 2b and the third bus bar 2c may be disposed apart from each other in the thickness direction, and each magnetic detection element 3a to 3c may be disposed between the first and second bus bars 2a and 2b and the third bus bar 2c.

Further, although in the above embodiment, the case where the distance between the first bus bar 2a and the first magnetic detection element 3a is equal to the distance between the second bus bar 2b and the second magnetic detection element 3b has been described, the present invention is not limited to this, but these distances may be different. Also in this case, as in the above embodiment, it is desirable that the first and second magnetic detection elements 3a and 3b are arranged so that the ratio Db/Da×100 is 0.5% or less. It is more desirable that the first and second magnetic detection elements 3a and 3b are arranged so that the ratio Db/Da×100 is 0.1% or less. That is, in this case, the tilt angle of the first magnetic detection element 3a is different from the tilt angle of the second magnetic detection element 3b. Note that the tilt directions of the two magnetic detection elements 3 with respect to the thickness direction are arranged so as to be the opposite directions, as in the above embodiment.

Furthermore, although not mentioned in the above embodiment, a pair of shield plates may be provided in such a manner as to sandwich the bus bars 2a to 2c and the magnetic detection elements 3a to 3c from the thickness direction to further suppress the influences due to the disturbances. Further, the bus bars 2a to 2c and the magnetic detection elements 3a to 3c may be covered with a mold resin.

SUMMARY OF THE EMBODIMENT

Next, the technical ideas grasped from the above-described embodiments will be described with the aid of reference numerals and the like in the embodiments. It should be noted, however, that each of the reference numerals and the like in the following description does not limit the constituent elements in the claims to the members and the like specifically shown in the embodiments.

[1] A current sensor (1), comprising: three bus bars (2), each of which is formed in a plate shape and through which respective phase currents of three-phase alternating currents respectively flow; and three magnetic detection elements (3) to detect a magnetic field strength generated by the currents flowing through the corresponding bus bars (2), wherein the three bus bars (2) include first and second bus bars (2a, 2b) aligned and arranged in such a manner to be spaced from each other in a plate width direction, and a third bus bar (2c) arranged in such a manner that a plate thickness direction thereof coincides with the plate thickness direction of the first and second bus bars (2a, 2b) and a length direction thereof is orthogonal to the length direction of the first and second bus bars (2a, 2b), wherein the three magnetic detection elements (3) include first and second magnetic detection elements (3a, 3b) arranged opposite the first and second bus bars (2a, 2b) respectively in the plate thickness direction, and a third magnetic detection element (3c) arranged opposite the third bus bar (2c) in the plate thickness direction, wherein the first and second magnetic detection elements (3a, 3b) are gradient detection type magnetic detection elements that output a difference between magnetic field strengths detected at two magnetic sensing positions, respectively, and are arranged in such a manner that a detection axis direction thereof is perpendicular to the length direction of the first and second bus bars (2a, 2b) and is tilted with respect to the plate thickness direction of the first and second bus bars (2a, 2b), wherein the third magnetic detection element (3c) is arranged in such a manner that a detection axis direction thereof coincides with the plate width direction of the third bus bar (2c).

[2] The current sensor (1) according to [1] above, wherein the third magnetic detection element (3c) is a gradient detection type magnetic detection element that outputs a difference between magnetic field strengths detected at two magnetic sensing positions.

[3] The current sensor (1) according to [1] or [2] above, wherein the first and second bus bars (2a, 2b) are disposed on one side of the third bus bar (2c) in the plate thickness direction and the third magnetic detection element (3c) is disposed on one side of the third bus bar (2c) and the second bus bar is disposed at a position on one side of the third bus bar (2c) and between the first bus bar and the second bus bar in the plate width direction of the first and second bus bars (2a, 2b).

[4] The current sensor (1) according to any one of [1] to [3] above, wherein the first and second magnetic detection elements (3a, 3b) are arranged in such a manner that the center position thereof is opposed to the plate width direction center position of the third bus bar (2c) in the plate thickness direction.

[5] The current sensor (1) according to any one of [1] to [4] above, wherein the first and second magnetic detection elements (3a, 3b) are arranged so that distances along the plate thickness direction from the corresponding bus bars (2) respectively are substantially equal to each other.

[6] The current sensor (1) according to any one of [1] to [5] above, wherein the first and second magnetic detection elements (3a, 3b) are arranged substantially symmetrically with respect to a plane having a normal direction in the plate width direction of the first and second bus bars (2a, 2b).

Although the embodiment of the present invention has been described above, the embodiment described above does not limit the invention according to the claims. It should also be noted that not all combinations of the features described in the embodiments are indispensable to the means for solving the problem of the invention. Further, the present invention can be appropriately modified and carried out within the scope not deviating from the spirit thereof.

What is claimed is:
1. A current sensor, comprising:
    three bus bars, each of which is formed in a plate shape and through which respective phase currents of three-phase alternating currents respectively flow; and three magnetic detection elements to detect a magnetic field strength generated by the currents flowing through the corresponding bus bars, wherein the three bus bars include first and second bus bars aligned and arranged in such a manner to be spaced from each other in a plate width direction, and a third bus bar arranged in such a manner that a plate thickness direction thereof coincides with a plate thickness direction of the first and second bus bars and a length direction thereof is orthogonal to a length direction of the first and second bus bars, wherein the three magnetic detection elements include first and second magnetic detection elements arranged opposite the first and second bus bars respectively in the plate thickness direction, and a third magnetic detection element arranged opposite the third bus bar in the plate thickness direction, wherein the first and second magnetic detection elements are gradient detection type magnetic detection elements that output a difference between magnetic field strengths detected at two magnetic sensing positions, respectively, and are arranged in such a manner that a detection axis direction thereof is perpendicular to the length direction of the first and second bus bars and is tilted at an angle with respect to the plate thickness direction of the first and second bus bars, wherein the third magnetic detection element is arranged in such a manner that a detection axis direction thereof coincides with a plate width direction of the third bus bar.

2. The current sensor according to claim 1, wherein the third magnetic detection element is a gradient detection type magnetic detection element that outputs a difference between magnetic field strengths detected at two magnetic sensing positions.

3. The current sensor according to claim 1, wherein the first and second bus bars are disposed on one side of the third bus bar in the plate thickness direction and the third magnetic detection element is disposed on the one side of the third bus bar and between the first bus bar and the second bus bar in the plate width direction of the first and second bus bars, the first and second magnetic detection elements being disposed on the one side of the third bus bar.

4. The current sensor according to claim 1, wherein the first and second magnetic detection elements are arranged in such a manner that center positions thereof coincide with the plate width direction center position of the third bus bar in the plate thickness direction.

5. The current sensor according to claim 1, wherein the first and second magnetic detection elements are arranged so that distances along the plate thickness direction from corresponding bus bars respectively are substantially equal to each other.

6. The current sensor according to claim 1, wherein the first and second magnetic detection elements are arranged substantially symmetrically with respect to a plane having a normal direction in the plate width direction of the first and second bus bars.

* * * * *